(12) United States Patent
Matsumoto et al.

(10) Patent No.: US 6,714,461 B2
(45) Date of Patent: Mar. 30, 2004

(54) SEMICONDUCTOR DEVICE WITH DATA OUTPUT CIRCUIT HAVING SLEW RATE ADJUSTABLE

(75) Inventors: Junko Matsumoto, Hyogo (JP); Tadaaki Yamauchi, Hyogo (JP); Takeo Okamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 91 days.

(21) Appl. No.: 10/139,751

(22) Filed: May 7, 2002

(65) Prior Publication Data
US 2002/0186596 A1 Dec. 12, 2002

(30) Foreign Application Priority Data
Jun. 12, 2001 (JP) ........................................ 2001-177034

(51) Int. Cl.[7] .................................................. G11C 7/00
(52) U.S. Cl. ............................ 365/189.05; 365/189.09; 365/189.11; 365/189.12
(58) Field of Search ...................... 365/189.05, 189.12, 365/189.09, 189.11, 226

(56) References Cited

U.S. PATENT DOCUMENTS 5,315,174 A * 5/1994 Chang et al. ................ 326/27
6,242,941 B1 * 6/2001 Vest et al. .................... 326/26
6,291,869 B1 * 9/2001 Ooishi ......................... 257/500
6,535,435 B2 * 3/2003 Tanaka et al. ............ 365/189.09

FOREIGN PATENT DOCUMENTS

| JP | 61-212116 | 9/1986 |
|----|-----------|--------|
| JP | 5-167425 | 7/1993 |
| JP | 6-104725 | 4/1994 |
| JP | 8-340020 | 12/1996 |
| JP | 10-255468 | 9/1998 |
| JP | 11-213665 | 8/1999 |

* cited by examiner

*Primary Examiner*—Son T. Dinh
(74) *Attorney, Agent, or Firm*—McDermott, Will & Emery

(57) ABSTRACT

Data for switching a slew rate of a data output circuit included in a data input/output circuit between a slew rate in a normal mode and a slow slew rate is stored in a mode register. According to the data stored in mode register, a slew rate setting signal is generated. According to a slew rate switching circuit, the slew rate of the data input/output circuit is switched between a slew rate in the normal mode and a slow slew rate slower than the slew rate in the normal mode. A data output circuit is achieved which occupies a small area, is capable of setting a slew rate slower than the slew rate in a normal mode and outputting data without causing an erroneous operation with a low consumption current even when the slew rate is adjusted.

13 Claims, 7 Drawing Sheets

| SLWM | L : NORMAL MODE | | H : SLOW MODE | |
|---|---|---|---|---|
| DQ | H | L | H | L |
| /HO1 | L | H | L | H |
| /HO2 | L | H | H | H |
| /LO1 | L | H | L | H |
| /LO2 | L | H | L | L |

| SLWM | L : NORMAL MODE | | H : SLOW MODE | |
|---|---|---|---|---|
| DQ | H | L | H | L |
| /HO1 | L | H | H | H |
| /HO2 | H | H | L | H |
| LO1 | L | H | L | L |
| LO2 | L | L | L | H |

SEMICONDUCTOR DEVICE WITH DATA OUTPUT CIRCUIT HAVING SLEW RATE ADJUSTABLE

BACKGROUND OF THE INVENTION

1. Field of the Invention

The present invention relates to a semiconductor device for outputting a signal externally and more particularly, to an output circuit for outputting data in a semiconductor device. Specifically, the invention relates to the configuration of a data output circuit capable of adjusting data output speed so as to output data at high speed without causing ringing. More specifically, the invention relates to a semiconductor device capable of switching a slew rate between a normal mode and a slow slew rate mode slower than the normal mode.

2. Description of the Background Art

As an example of a semiconductor circuit device operating synchronously with an external clock signal, there is a clock synchronous memory. In the clock synchronous memory, data is input and output synchronously with a clock signal. A data transfer speed can be therefore determined by an external clock signal, and high-speed data transfer can be achieved.

In such a clock synchronous memory, in order to drive an external load at high speed for outputting data synchronously with a clock signal, an output buffer circuit is provided.

FIG. 18 is a diagram showing an example of the configuration of a conventional output buffer circuit. In FIG. 18, the output buffer circuit includes: a P-channel MIS (insulated gate type field effect) transistor PQ connected between a power supply node and an output node DN, and receiving internal read data VO at a gate thereof; and an N-channel MIS transistor NQ connected between output node DN and a ground node, and receiving internal read data VO at a gate thereof. To the output buffer circuit, in order to suppress an influence on an internal circuit in data output operation, a power supply voltage VDDQ dedicated to the data output is applied. Internal read data VO is therefore a signal having an amplitude of the level of power supply voltage VDDQ. Generally, output power supply voltage VDDQ is a power supply voltage higher than an internal power supply voltage and the level converting (from the internal power supply voltage level to the output dedicated power supply voltage on an internal data) is performed to generate the internal read data VO.

When internal read data VO is at an H level (logical high level), N-channel MIS transistor NQ is in an ON state, and P-channel MIS transistor PQ is in an OFF state. Output node DN is discharged to the ground voltage level, and output data DQ attains an L level (Logical low level).

When internal read data VO is at the L level, P-channel MIS transistor PQ is in the ON state and N-channel MIS transistor NQ is in the OFF state. In this state, output node DN is driven to the output power supply voltage VDDQ level, and output data DQ attains the H level.

By using the output buffer circuit as shown in FIG. 18, the external load on output node DN is driven at high speed and data is output at high speed.

The output driving capability (slew rate) of a conventional output buffer circuit is optimally designed so as not to cause ringing in an output signal. Usually, the slew rate is adjusted by controlling the current supplying capability of a MIS transistor for driving an output node. In a clock synchronous memory such as an SDRAM (synchronous dynamic random access memory), the frequency of a clock signal is designated according to the application. Therefore, the output driving capability (slew rate) of the output buffer circuit is also set as a default value.

In the manufacturing stage, the slew rate is trimmed (finely tuned) so as to satisfy the default value. When the external clock signal is a clock signal in the range specified as a default value, the output node can be driven at high speed according to the external clock signal, without causing ringing.

However, when an output load is unchanged even where the frequency of the external clock signal is decreased, although an output data signal can be generated without causing ringing, since the output buffer circuit operates at a higher speed than need be, such a problem occurs that a current is unnecessarily consumed.

Even if the external clock signal is a clock signal corresponding to the default value, when the external load connected to the output node of the output buffer circuit becomes lighter depending on an application, the output node is equivalently driven by a greater current driving capability, and it consequently causes a problem of occurrence of ringing. Generally, as the external load, the minimum external load is set as a specification value. Therefore, when the output load lighter than the specification value is connected, the slew rate of the output buffer circuit is not adjusted from the viewpoint of a simplification of the circuit configuration.

Conventionally, the output node is usually driven by an output driving capability optimally set as a default value. The slew rate is not conventionally adjusted by setting the output driving capability (slew rate) to be smaller than the default value in the normal mode.

Japanese Patent Laying-Open No. 11-213665(1999) discloses a configuration of detecting the frequency of a clock signal and setting the number of output driving transistors in accordance with the detected clock signal frequency in order to adjust the slew rate in accordance with the clock frequency. In the prior art, in order to address an increase in the frequency of an external clock signal in association with technical development, the slew rate can only be set to be higher than the default value by selectively increasing the number of output transistors but can not be set to be lower than the default value. Consequently, the prior art has a problem that its application is limited.

In the case of adjusting the output driving capability of the output buffer circuit, when the slew rate is set to be low, speed in change of an output signal becomes slow. From a viewpoint of a high speed operation of the whole system, however, a signal has to be driven to a definite state at a timing as fast as possible. In the conventional slew rate adjustment, only the output driving capability of the transistor is adjusted, but the signal output timing is not adjusted.

In the adjustment of the slew rate, in order to adjust the driving capability of a pull-up output transistor for driving an output node to the H level or a pull-down output transistor for driving an output node to the L level in an output buffer circuit, an adjusting transistor of the same conductivity type as that of the output transistor is employed and is selectively set in an ON state. The step of adjusting the slew rate is therefore determined by an adjusting step of the driving capability of the adjusting transistor of the same conductivity type, and there is a problem that the slew rate adjustment width can not be narrowed.

Particularly, in the case of decreasing the slew rate by using the transistor of the same conductivity type as a slew rate adjusting transistor, the timing of definition of an output signal is delayed. Consequently, a problem that the output data signal cannot be transferred at high speed without causing ringing occurs.

In a normal output circuit, as the transistors for driving an output node in the same direction independently of slew rate adjustment, the transistors of the same conductivity type are used. This is because a circuit occupying area is increased due to necessity of a well isolation region if the transistors of opposite conductivity type are used. In the case of using a P-channel MIS transistor (insulated gate field effect transistor), the current driving capability is smaller than that of an N-channel MIS transistor. In order to obtain a necessary current driving capability, the size (ratio of channel length and channel width) of the P-channel MIS transistor is set to be large, and such a problem arises that the circuit occupying area increases.

Such a problem of the output buffer circuit similarly occurs not only in the above-described clock synchronous memory but also in an output circuit of a normal semiconductor integrated circuit device.

SUMMARY OF THE INVENTION

An object of the invention is to provide a semiconductor device capable of setting an output driving capability to be smaller than a default value for adjusting a slew rate.

Another object of the invention is to provide a semiconductor device capable of adjusting a slew rate without changing the definition timing of an output signal.

Further object of the invention is to provide a semiconductor device capable of accurately adjusting a slew rate while suppressing an increase of a circuit occupying area as much as possible.

Further another object of the invention is to provide a semiconductor device capable of pulling up an output signal at high speed without increasing a circuit occupying area.

A semiconductor device according to a first aspect of the invention includes: a plurality of transistors connected in parallel to an output node; a register circuit for storing data for setting an operation state of each of the transistors; and an output driving circuit for driving the plurality of transistors in accordance with an internal signal. In the register circuit, either a default value for designating a driving capability of the output node in a normal mode or data for designating a slow slew rate mode for designating a driving capability smaller than that in the normal mode is stored. The output driving circuit drives the plurality of transistors selectively in accordance with the internal signal based on data stored in the register circuit.

A semiconductor device according to a second aspect of the invention includes first and second insulated gate field effect output transistors of different conductivity types from each other connected between a power source node and an output node. The first and second output transistors drive the output node in the same direction in accordance with an output control signal. The first output transistor is formed in a semiconductor substrate region of a first conductivity type, and the second output transistor is formed in a semiconductor substrate region of a second conductivity type formed, in the first substrate region, being surrounded by the first semiconductor substrate region.

A semiconductor device according to a third aspect of the invention includes: a level converting circuit, receiving an external power supply voltage as an operation power supply voltage, for converting a level of an internal output signal having a first amplitude to convert an amplitude of the internal output signal; a driving circuit receiving the external power supply voltage as an operation power supply voltage and generating an output control signal in accordance with an output signal of the level converting circuit; an output transistor for driving an output node to the external power supply voltage level in accordance with the output control signal from the driving circuit; and a reset transistor for driving an output node of the level converting circuit to a voltage level at which the output transistor is turned off in accordance with a voltage level of an external power supply node receiving the external power supply voltage.

By changing the default value stored in the register circuit, the number of transistors for driving the output node can be changed, and the driving capability of the output node, or the slew rate can be set to be smaller than the default value.

By making the conductivity types of the transistors driving the output in the same direction when conductive, different from each other and forming the substrate region for forming the transistor of one conductivity type in the semiconductor substrate region for forming the transistor of the other conductivity type, a region for isolating the transistor forming regions becomes unnecessary, so that the circuit occupying area can be reduced. By using the transistors of different conductivity types, the driving capability of the transistor for driving the output node can be efficiently adjusted. Thus, with a small circuit occupying area, the output node can be driven at high speed.

When the output transistor drives the output node in accordance with a level-converted signal, by setting the voltage level of the output node of the level converting circuit to a voltage level at which the output transistor is turned off in accordance with the power supply voltage level, the output transistor can be turned off reliability irrespective of a power up sequence and a power down sequence. Thus, a power consumed at the time of turning up and down the power supply can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
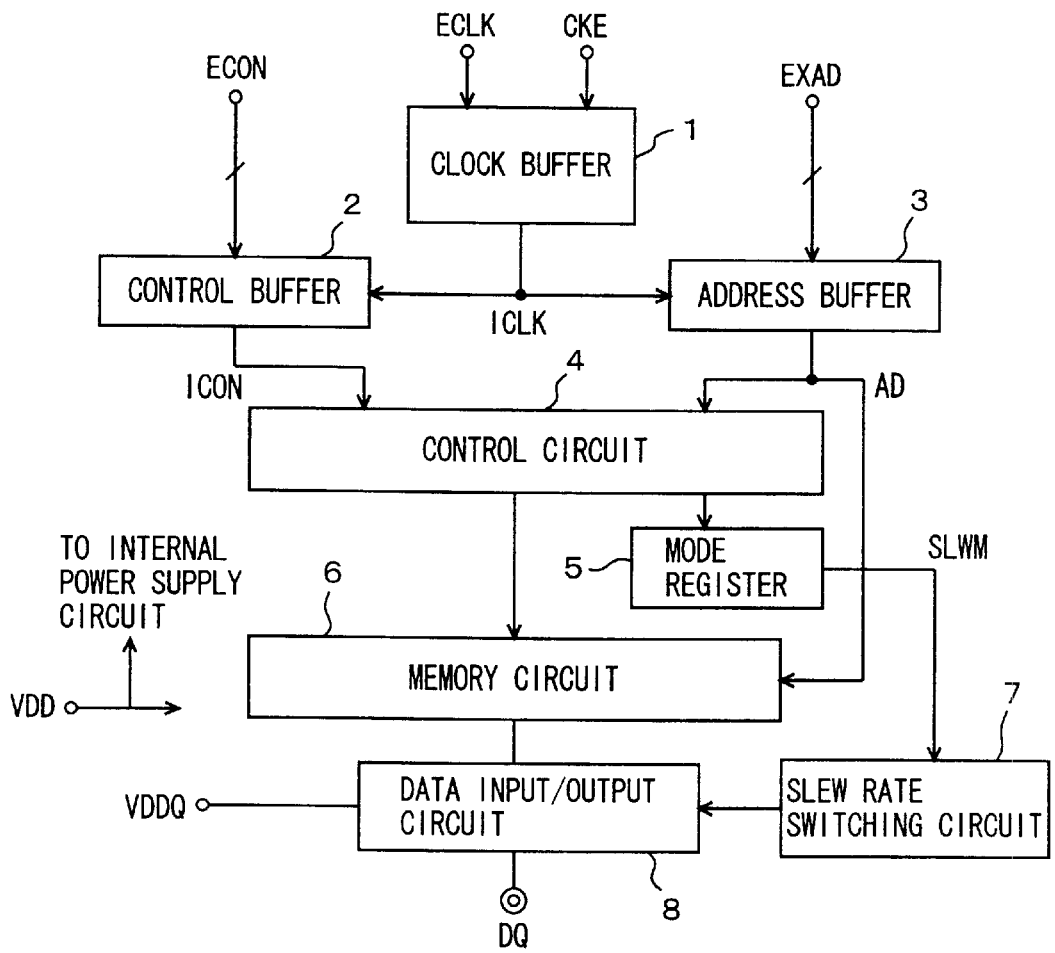
FIG. 1 is a diagram schematically showing an entire configuration of a semiconductor memory device according to a first embodiment of the invention.

FIG. 1 is a diagram schematically showing an entire configuration of a semiconductor memory device according to a first embodiment of the invention. In FIG. 1, the semiconductor memory device includes: a clock buffer 1 receiving an external clock enable signal CKE and an external clock signal ECLK and generating an internal clock signal ICLK in accordance with external clock signal ECLK when clock enable signal CKE is made active; a control buffer 2 for taking in an external control signal group ECON synchronously with internal clock signal ICLK and generating an internal control signal group ICON; an address buffer 3 for taking in an external address signal EXAD synchronously with internal clock signal ICLK and generating an internal address signal AD; a control circuit 4 for generating control signals necessary for various internal operations in accordance with internal control signal ICON and internal address signal AD from control buffer 2 and address buffer 3, respectively; a mode register 5 for storing data indicative of various operation states of the semiconductor memory device; a memory circuit 6 operating under control of control circuit 4, selecting an addressed memory cell in accordance with internal address signal AD from address buffer 3 and performing internal writing/reading of data to the selected memory cell; a data input/output circuit 8 for inputting/outputting data between memory circuit 6 and an outside; and a slew rate switching circuit 7 for switching the slew rate of an data output circuit included in data input/output circuit 8 between a normal mode and a slow slew rate mode in accordance with a slew rate setting signal SLWM stored in mode register 5.

Memory circuit 6 includes a plurality of memory cells, a memory cell selecting circuit, and peripheral circuitry. The peripheral circuitry includes a signal line precharge circuit, an internal data read circuit, and an internal data write circuit and such.

The semiconductor memory device shown in FIG. 1 is a clock synchronous memory, takes in external signals ECON and EXAD synchronously with external clock signal ECLK, generates various internal control signals necessary for operations designated in accordance with an operation mode designated by the taken in control signal group, and receives/transmits data synchronously with external clock signal EXCLK via data input/output circuit 8.

When a mode register set command is applied by a combination of predetermined bits of external control signal group ECON and external address signal EXAD and a mode of storing data into the mode register 5 is designated, mode register 5 stores a predetermined address signal bit supplied from address buffer 3 as mode designation data under control of control circuit 4. In mode register 5, column latency information indicative of the number of clock cycle (s) since a data access command is supplied until valid data is read and output externally, data of burst length indicative of the number of data to be successively read in response to an access command supplied, and others are stored.

More register 5 additionally includes a register circuit for storing a slew rate setting signal for switching the slew rate of the data output circuit included in data input/output circuit 8 between the normal mode and the slow slew rate mode.

Slew rate switching circuit 7 sets either the normal mode or the slow slew rate mode as the slew rate of the data output circuit in data input/output circuit 8 in accordance with slew rate setting signal SLWM stored in mode register 5.

By adjusting the slew rate of the data output circuit with mode register 5, the optimum slew rate can be set according to an environment in which the semiconductor memory device is used.

Figure 2:
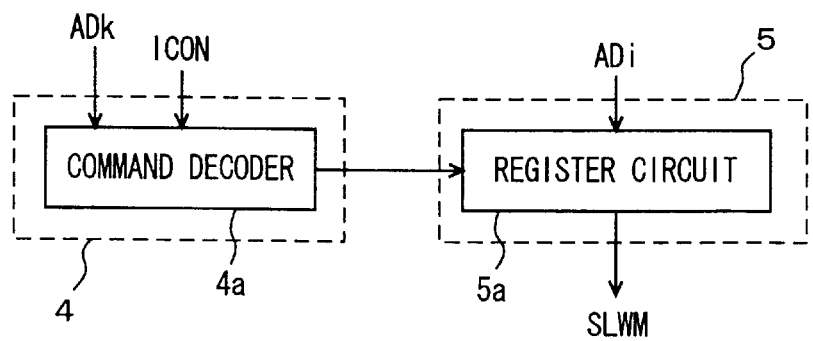
FIG. 2 is a diagram schematically showing the configuration of a portion related to setting of a slew rate of the semiconductor memory device illustrated in FIG. 1.

FIG. 2 is a diagram schematically showing the configuration of a portion related to control circuit 4 and the slew rate of mode register 5 illustrated in FIG. 1. In FIG. 2, control circuit 4 includes a command decoder 4a for receiving internal control signal group ICON from control buffer 2 and a specific address signal bit ADk from address buffer 3, and determining whether the mode register set command is supplied or not. When the signals of internal control signal group ICON and the specific address signal bit ADk are set in predetermined logic states, command decoder 4a determines that the mode register set command is supplied, and generates a mode register set instruction signal to mode register 5.

Mode register 5 includes a register circuit 5a for taking in a predetermined internal address signal bit ADi as slew rate setting data in response to a mode register set instruction signal from command decoder 4a, and generating slew rate setting signal SLWM. In register circuit 5a, a signal for setting a slew rate in the normal mode is stored as a default value. For example, when a reset signal is supplied, slew rate setting signal SLWM is set, as the default value, to a predetermined level, for example, L level.

The mode register set command dedicated to set the slew rate may be provided. Alternatively, when the mode register set command for designating burst length and column latency is supplied, slew rate setting data may be simultaneously stored.

Figure 3:
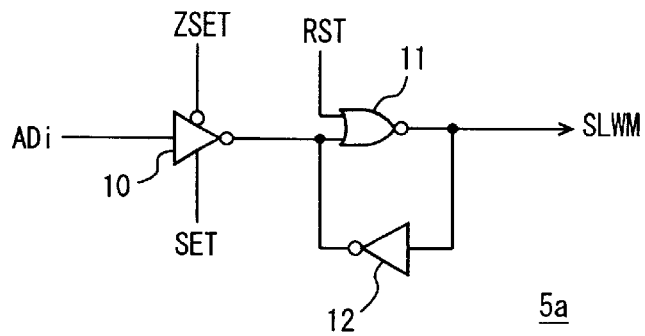
FIG. 3 is a diagram showing an example of the configuration of a register circuit illustrated in FIG. 2.

FIG. 3 is a diagram showing an example of the configuration of register circuit 5a. In FIG. 3, register circuit 5a includes: a tri-state inverter buffer 10, selectively activated in accordance with mode register set instruction signals SET and ZSET from command decoder 4a, for inverting address signal bit ADi; an NOR circuit 11 receiving a reset signal RST and an output signal of tri-state inverter buffer 10 and generating slew rate setting signal SLWM through a negative logical sum (NOT and OR) operation performed on the received signals; and an inverter 12 for inverting slew rate setting signal SLWM and transmitting a resultant signal to the output of tri-state inverter buffer 10.

Reset signal RST is activated (or driven to the H level) upon system resetting or power up. Tri-state inverter buffer 10 is activated when mode register set instruction signals SET and ZSET attains the H level and the L level, respectively, inverts address signal bit ADi, and supplies the inverted signal to NOR circuit 11. When mode register set instruction signals SET and ZSET attains the L level and the H level, respectively, tri-state inverter buffer 10 enters an output high-impedance state.

When reset signal RST goes high, NOR circuit 11 sets slew rate setting signal SLWM to the L level. When reset signal RST goes low, NOR circuit 11 operates as an inverter, and forms a latch circuit with inverter 12. When the mode register set command is not supplied, therefore, slew rate setting signal SLWM is simply set to the L level as a default value in accordance with reset signal RST. When slew rate setting signal SLWM is at the L level, the normal mode of data outputting is designated. That is, as a default, slew rate setting signal SLWM is set to the L level to designate the normal mode.

Figure 4:
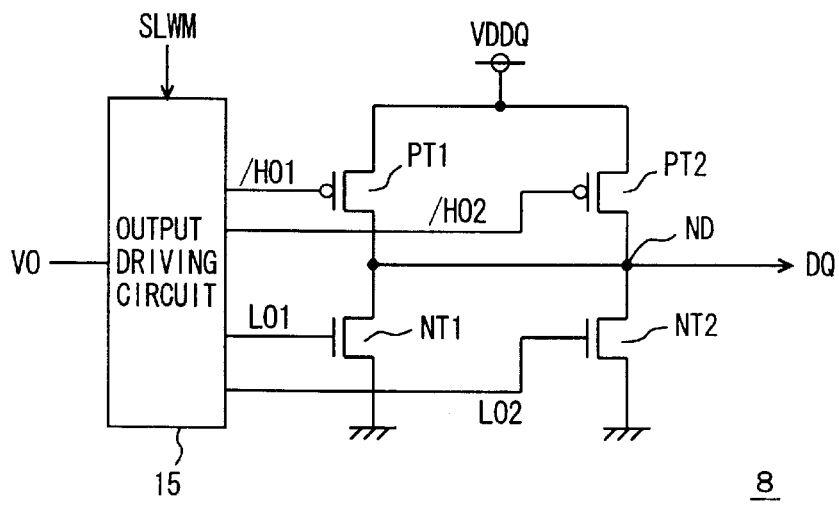
FIG. 4 is a diagram schematically showing the configuration of a data output circuit according to the first embodiment of the invention.

FIG. 4 is a diagram showing an example of the configuration of the data output circuit included in data input/output circuit 8 illustrated in FIG. 1. In FIG. 4, the data output circuit includes: P-channel MIS transistors PT1 and PT2 connected in parallel with each other between an output node ND and a power supply node; N-channel MIS transistors (insulated gate field effect transistors) NT1 and NT2 connected in parallel with each other between output node ND and a ground node; and an output driving circuit 15 for generating control signals /HO1, /HO2, LO1, and LO2 for MIS transistors PT1, PT2, NT1, and NT2, respectively, in accordance with internal read data VO and slew rate setting signal SLWM.

In the configuration of the output circuit shown in FIG. 4, slew rate switching circuit 7 is provided in the data output circuit. That is, slew rate switching circuit 7 and the data output circuit are combined into unification.

P-channel MIS transistors PT1 and PT2 for pulling up output node ND are connected in parallel to output node ND. N-channel MIS transistors NT1 and NT2 for pulling down output node ND are connected in parallel to output node ND. By individually controlling MIS transistors PT1, PT2, NT1, and NT2 in accordance with which the slew rate mode is, the normal mode or the slow slew rate mode, the slew rate can be easily switched.

Figure 5:
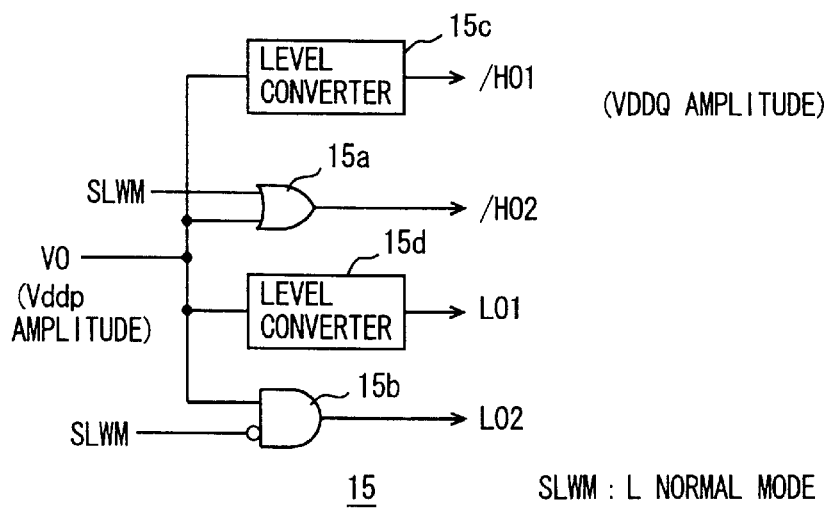
FIG. 5 is a diagram showing an example of the configuration of an output driving circuit illustrated in FIG. 4.

FIG. 5 is a diagram showing an example of the configuration of output driving circuit 15 illustrated in FIG. 4. In FIG. 5, output driving circuit 15 includes: an OR circuit 15a, having a level converting function, receiving internal read data VO and slew rate setting signal SLMW and generating output control signal /HO2; a gate circuit 15b, having a level converting function, receiving internal read data DO and slew rate setting signal SLMW and generating output control signal LO2; a level converting circuit 15c for converting the amplitude of internal read data VO to a signal of the output power supply voltage level to generate output control signal /HO1; and a level converting circuit 15d for converting the amplitude of internal read data VO to a signal of the output power supply voltage level to generate output control signal LO1.

Internal read data VO is generated by a circuit receiving internal power supply voltage Vddp as an operation power supply voltage and has an amplitude at an internal power supply voltage level. To drive the output node at speed as high as possible, output power supply voltage VDDQ is set higher than internal power supply voltage Vddp. The level conversion is performed by level converting circuits 15c and 15d, OR circuit 15a, and gate circuit 15b to turn the transistors in the data output circuit into an ON/OFF state reliably.

Although level converting circuits 15c and 15d each perform level converting operation, they does not convert the logic level of a signal.

In the configuration shown in FIG. 5, a circuit for generating internal read data in accordance with an output enable signal DOM may be provided at the preceding stage. The internal read data is a signal having an amplitude of the internal power supply voltage Vddp level. In the configuration of converting the level of a signal to generate the output control signals for the output transistors, the configuration of the portion of generating internal read data VO may be any.

In the configuration of output driving circuit 15 shown in FIG. 5, when slew rate setting signal SLMW is at the L level as a default value, the normal mode is designated.

Figures 6, 7, 8:
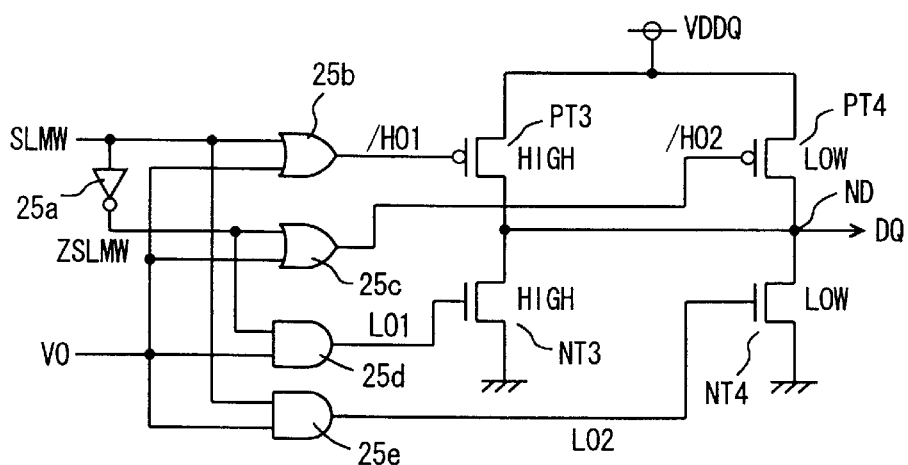
FIG. 6 is a truth table of operations of the circuit illustrated in FIG. 5.
FIG. 7 is a diagram showing the configuration of a data output circuit according to a second embodiment of the invention.
FIG. 8 is a truth table of data output logic of operations of the circuit illustrated in FIG. 7.

FIG. 6 is a truth table of the operations of output driving circuit 15 illustrated in FIG. 5. Referring to FIG. 6, the operation of the output driving circuit illustrated in FIG. 5 will be described in the following. In the truth values, the current driving capabilities of output transistors PT1 and PT2 are set to be substantially the same, and the current driving capabilities of output transistors NT1 and NT2 are also set to be substantially the same. By setting the sizes (the ratio of channel length and channel width) of the transistors (of the same conductivity type) to the same, the current driving capabilities can be made equal to each other.

In the normal mode, slew rate setting signal SLWM is at the L level, and each of OR circuit 15a and gate circuit 15b operates as a buffer circuit. Level converting circuits 15c and 15d perform only the level converting, but do not perform logic level converting.

In this case, therefore, output control signals /HO1, /HO2, LO1, and LO2 are generated in accordance with internal read data VO. When internal read data VO is at the L level, all of output control signals /HO1, /HO2, LO1, and LO2 are at the L level. In this state, pull-up P-channel MIS transistors PT1 and PT2 shown in FIG. 4 are turned on, output node ND is charged to output power supply voltage VDDQ level, and external output data DQ goes high.

In the normal mode, when internal read data VO is at the H level, all of output control signals /HO1, /HO2, LO1 and LO2 from output driving circuit 15 are at the H level. Therefore, in FIG. 4, N-channel MIS transistors NT1 and NT2 are turned on, output node ND is discharged to the ground voltage level, and external output data DQ goes low.

When slew rate setting signal SLWM is set to the H level and the slow slew rate mode in which the slew rate is made slower than that in the normal mode is designated, output control signal /HO2 output from OR circuit 15a is fixed to the H level, and output control signal LO2 output from gate circuit 15b is fixed to the L level. MIS transistors PT2 and NT2 shown in FIG. 4 are therefore fixed in the OFF state. In this state, output control signals /HO1 and LO1 are generated in accordance with internal read data VO, and output node ND is driven in accordance with MIS transistors PT1 and NT1. Since an operation of pulling up/down output node ND is performed by one MIS transistor PT1 or NT1, a changing speed of output data DQ is slow and the slew rate is therefore low, as compared with the normal mode of pulling up/down output node ND by two MIS transistors PT1 and PT2 or NT1 and NT2.

By providing the MIS transistors controlled individually in parallel to the output node and setting the transistors to selectively an operable state in accordance with the slew rate setting signal, the slew rate can be easily decreased.

Second Embodiment

FIG. 7 is a diagram showing the configuration of a data output circuit according to a second embodiment of the invention. In FIG. 7, the data output circuit includes P-channel MIS transistors PT3 and PT5 connected in parallel between the power supply node and the output node, and N-channel MIS transistors NT3 and NT4 connected in parallel between output node ND and the ground node. The current driving capability of p-channel MIS transistor PT3 is set to be lower than that of P-channel MIS transistor PT4. The current driving capability of N-channel MIS transistor NT3 is set to be higher than that of N-channel MS transistor NT4.

In the normal mode, output node ND is driven by MIS transistors PT3 and NT3. In the slow slew rate mode, output node ND is driven by MIS transistor PT4 or NT4. The output driving circuit for driving output MIS transistors PT3, PT4, NT3, and NT4 in accordance with internal read data VO includes: an inverter 25a for inverting slew rate setting signal SLMW; an OR circuit 25b for receiving internal read data VO and slew rate setting signal SLMW and generating and supplying output control signal /HO1 to the gate of MIS transistor PT3; an OR circuit 25c receiving complementary slew rate setting signal ZSLMW from inverter 25a and internal read data VO and generating output control signal /HO2 onto the gate of MIS transistor PT4; an AND circuit 25d receiving internal read data VO and complementary slew rate setting signal ZSLMW and generating output control signal LO1 onto the gate of MIS transistor NT3; and an AND circuit 25e receiving slew rate setting signal SLMW and internal read data VO and generating output control signal LO2 onto the gate of MIS transistor NT4.

Each of gate circuits 25b to 25e has a level converting function, similarly to the configuration of the first embodiment.

When slew rate setting signal SLMW is at the L level, the normal mode is designated. When slew rate setting signal is at the H level, the slow slew rate mode of decreasing the slew rate to be lower than that in the normal mode is designated. The operation of the data output circuit shown in FIG. 7 will now be described, referring to the truth table of FIG. 8.

In the normal mode, slew rate setting signal SLMW is at the L level, and complementary slew rate signal ZSLMW from inverter 25a is at the H level. Therefore, output control signal /HO2 output from OR circuit 25c is fixed at the H level, and output control signal LO2 output from AND circuit 25e is fixed at the L level. OR circuit 25b and AND circuit 25d operate as a buffer circuit and generate output control signals /HO1 and LO1 in accordance with internal read data VO. Therefore, when internal read data VO is at the L level, output control signals /HO1 and LO1 go low and output node ND is driven to the power supply voltage VDDQ level in accordance with MIS transistor PT3.

When internal read data VO is at the H level, both output control signals /HO1 and LO1 go high, MIS transistor PT3 is turned off, MIS transistor NT3 is turned on, and output node ND is driven to the ground voltage level via MIS transistor NT3 that is in the ON state.

When slew rate setting signal SLWM is set to the H level, complementary slew rate setting signal ZSLMW turns low. In this state, therefore, output control signal LO1 output from AND circuit 25d is fixed to the L level and output control signal /HO1 output from OR circuit 25b is fixed to the H level. Accordingly, MIS transistors PT3 and NT3 are fixed to the OFF state.

OR circuit 25c and AND circuit 25e operate as a buffer circuit and generate output control signals /HO2 and LO2, respectively, in accordance with internal read data VO. When internal read data VO is at the L level, both output control signals /HO2 and LO2 go low, and output node ND is driven to the power supply voltage VDDQ level by MIS transistor PT4. When internal read data VO is at the H level, both output control signals /HO2 and LO2 go high, MIS transistor PT4 is turned off, MIS transistor NT4 is turned on, and output node ND is driven to the ground voltage level via MIS transistor NT4 being in the ON state.

In the case of utilizing the data output circuit as shown in FIG. 7, therefore, by making the current driving capabilities of MIS transistors PT3 and PT4 different from each other and making the current driving capabilities of MIS transistors NT3 and NT4 different from each other, the adjustment width of the slew rate can be set to the adjustment width of the current driving capability of the transistors. The current driving capability of each of MIS transistors PT3, PT4, NT3, and NT4 can be set to the optimum value by adjusting the ratio W/L of channel width W over channel length L.

Modification

Figure 9:
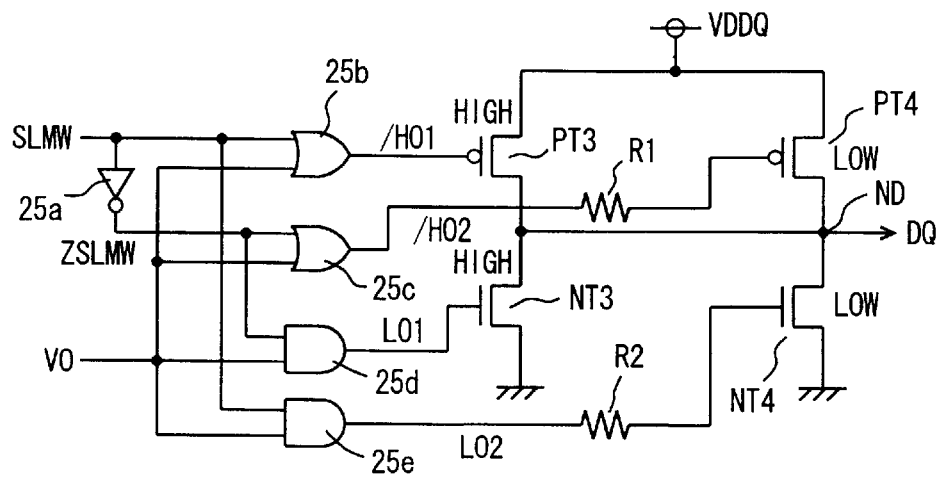
FIG. 9 is a diagram showing the configuration of a modification of the second embodiment of the invention.

FIG. 9 is a diagram showing a modification of the second embodiment of the invention. In a data output circuit shown in FIG. 9, output control signal /HO2 output from OR circuit 25c is transmitted to the gate of MIS transistor PT4 via a resistive element R1. Output control signal LO2 output from AND circuit 25e is supplied to the gate of MIS transistor NT4 via a resistive element R2. The other configuration is the same as that shown in FIG. 7, corresponding parts are designated by the same reference numerals, and the detailed description will not be repeated.

In the case of the configuration shown in FIG. 9, the changing speed of output control signals /HO2 and LO2 is decreased by resistive elements R1 and R2, and output control signals /HO2 and LO2 change slowly. Therefore, MIS transistors PT4 and NT4 slowly enter an ON/OFF state to slowly drive output node ND. Resistive elements R1 and R2 are delay elements which delay the rising edge and falling edge of a waveform, and enable the slew rate to be further decreased.

By using resistive elements R1 and R2 as delay elements for decreasing the changing speed of output control signals /HO2 and LO2, the slew rate can be set more finely in accordance with the resistance values of resistive elements R1 and R2.

Although two pull-up output driving transistors and two pull-down output driving transistors are disposed in the configuration of FIG. 9, three or more pull-up output driving transistors and three or more pull-down driving transistors may be disposed.

In the configuration shown in FIG. 9, the current driving capability of MIS transistor PT3 and that of PT4 may be the same and the current driving capability of MIS transistor NT3 and that of MIS transistor NT4 may be the same. In this case as well, by the delay function of resistive elements R1 and R2, the operation speed of MIS transistors PT4 and NT4 can be made slower than that of MIS transistors PT3 and NT3, and output node ND can be driven gently. Thus, the slow slew rate mode can be achieved.

As described above, according to the second embodiment of the invention, a plurality of transistors for driving the output node are selectively driven in accordance with the slew rate setting signal. The slew rate can be set to the optimum value in accordance with the current driving capability of each transistor.

In the slow slew rate mode, by supplying an output control signal to the gate of a corresponding output transistor via a delay element, the slew rate can be further decreased. According to the resistance values of the resistive elements, the slew rate can be finely adjusted.

Third Embodiment

Figure 10:
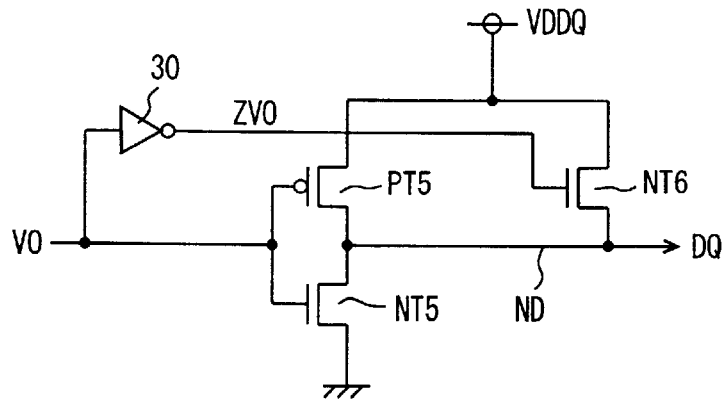
FIG. 10 is a diagram showing the configuration of a data output circuit according to a third embodiment of the invention.

FIG. 10 is a diagram showing the configuration of a data output circuit according to a third embodiment of the invention. In FIG. 10, the data output circuit includes: a P-channel MIS transistor PT5 connected between the power supply node and output node ND, and receiving internal read data VO at a gate thereof; an inverter 30 for inverting internal data VO; an N-channel MIS transistor NT6 connected between the power supply node and output node ND, and receiving an output signal ZVO of inverter 30 at a gate thereof, and an N-channel MIS transistor NT5 connected between output node ND and the ground node, and receiving internal read data VO4 at a gate thereof.

Internal read data VO shown in FIG. 10 has an amplitude of the output power supply voltage level.

Figure 11:
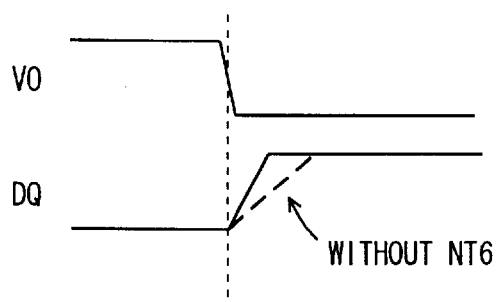
FIG. 11 is a signal waveform diagram representing the operation of the data output circuit illustrated in FIG. 10.

FIG. 11 is a signal waveform diagram representing the operation of the data output circuit of FIG. 10. Referring to FIG. 11, the operation of the data output circuit shown in FIG. 10 will now be described.

When internal read data VO is at the H level, MIS transistor NT5 is in the ON state, MIS transistors PT5 and NT6 are in the OFF state, and output node ND is held at the ground voltage level.

When internal read data VO turns L level from the H level, P-channel MIS transistor PT5 is turned on and N-channel MIS transistor NT5 is turned off. Output signal ZVO of inverter 30 goes high, and N-channel MIS transistor NT6 is turned on. Output node ND is therefore driven by MIS transistor PT5 or NT6.

P-channel MIS transistor has carriers formed of positive holes, and the operation speed thereof is slow. On the other hand, in the N-channel MIS transistor, the carriers are electrons, and charges can be transmitted at high speed Generally, in order to make the rising speed and the falling speed of an output speed equal to each other, when the P-channel MS transistor is used as a transistor for pulling up an output, the size (the ratio of channel width and channel length) of the P-channel MIS transistor is set to be sufficiently larger than the size of a normal N-channel MIS transistor, thereby equivalently equalizing the current driving capability of the P-channel MIS transistor and that of the N-channel MIS transistor. In this case, however, the area occupied by the P-channel MIS transistor increases and the layout area of the data output circuit increases.

By using N-channel MIS transistor NT6 auxiliarily for driving output node ND, the driving capability of P-channel MIS transistor PT5 is compensated for and output node ND can be driven to output power supply voltage VDDQ at high speed. Therefore, without increasing the circuit occupying area, time required for external output data DQ to transition from the L level to the H level can be reduced, and a high-speed access can be achieved.

It is sufficient that signal ZVO supplied to the gate of MIS transistor NT6 is at the output power supply voltage VDDQ level. The gate voltage or the signal ZVO does not have to be particularly increased to compensate for a threshold voltage loss of MIS transistor NT6, because output node ND is finally driven to output power supply voltage VDDQ by P-channel MIS transistor PT5. Inverter 30 may be configured to have the level converting function and boosts the signal ZVO to be supplied to the gate of MIS transistor NT6 to the high voltage Vpp level higher than output power supply voltage VDDQ. In this case, output node ND can be driven at higher speed.

Modification 1

Figure 12:
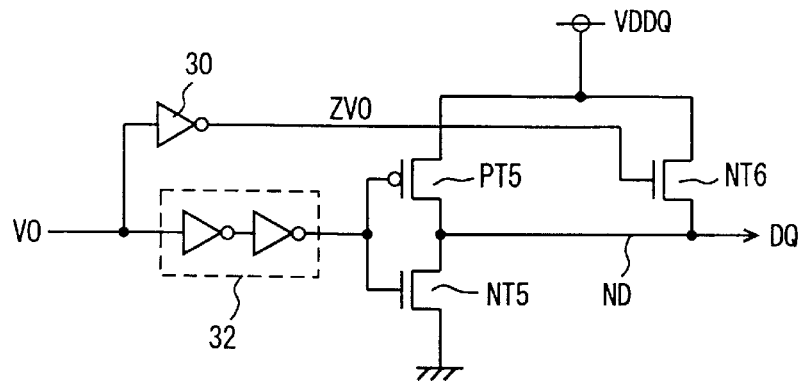
FIG. 12 is a diagram showing the configuration of a first modification of the third embodiment of the invention.

FIG. 12 is a diagram showing the configuration of a first modification of the third embodiment of the invention. In FIG. 12, in the data output circuit, internal read data VO is transmitted to the gates of MIS transistors PT5 and NT5 via a buffer circuit 32. The other configuration is the same as that of FIG. 10, corresponding parts are designated by the same reference numerals, and the detailed description will not be repeated.

Delay time of buffer circuit 32 is longer than the gate delay of inverter 30. Consequently, when P-channel MIS transistor PT5 is turned on, at a timing faster than that, N-channel MIS transistor NT6 is turned on to drive output node ND to the output power supply voltage level. The rising timing of the output signal can be advanced, and output data DQ can be driven from the L level to the H level at higher speed.

Alternately, internal read data VO may be directly supplied to the gate of N-channel MIS transistor NT5 without passing through buffer circuit 32. The period, in which both N-channel MIS transistors NT5 and NT6 are turned on and a through-current flows, can be shortened.

Modification 2

Figure 13:
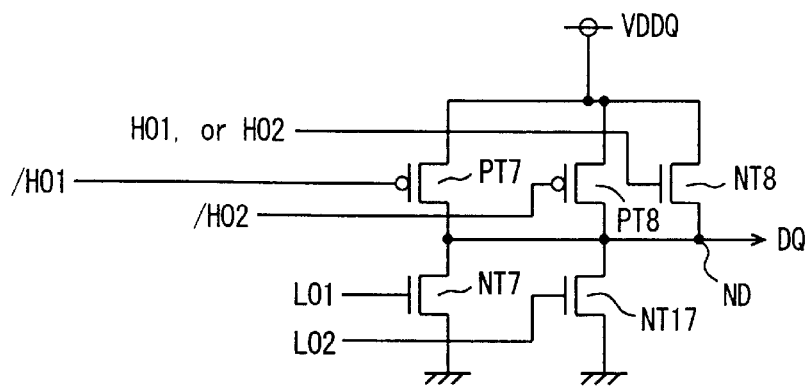
FIG. 13 is a diagram showing the configuration of a second modification of the third embodiment of the invention.

FIG. 13 is a diagram showing the configuration of a second modification of the third embodiment of the invention. In the configuration shown in FIG. 13, P-channel MIS transistors PT7 and PT8 and an N-channel MIS transistor NT8 are connected in parallel between output node ND and the power supply node, and N-channel MIS transistors NT7 and NT17 are connected in parallel between output node ND and the ground node. To the gates of P-channel MIS transistors PT7 and PT8, output control signals /HO1 and /H2 are supplied, respectively. To the gate of N-channel MIS transistor NT8, output control signal HO1 or HO2 is supplied.

Which of output control signals HO1 and HO2 is supplied to the gate of MIS transistor PT8 is determined according to the logic levels of output control signals HO1 and HO2 which is set in adjusting the slew rate. MIS transistor NT8 is made conductive when output data DQ is driven to the H level in both the normal slew rate mode and the slow slew rate mode.

Output control signals LO1 and LO2 are supplied to the gates of N-channel MIS transistors NT7 and NT17, respectively. Output control signals /HO1, /HO2, LO1, and LO2 are generated by the output driving circuit of either the foregoing first or second embodiment.

In the configuration shown in FIG. 13, in the case of driving output node ND to the H level in the normal mode, for example, both output control signals /HO1 and /HO2 go down and MIS transistor NT8 is made conductive in accordance with output control signal HO1 or HO2. Therefore, output node ND is driven to the H level at high speed.

On the other hand, when the slow slew rate mode is set, in the case of driving output node ND to the H level, MIS transistor PT7 is set in a non-conductive state. Both of MIS transistors PT8 and NT8 are set in the conductive state or only MIS transistor NT8 is set in the conductive state. In the slow slew rate mode in which the slew rate is made lower than that in the normal mode, output node ND is driven by a relatively small current driving capability, and occurrence of ringing can be prevented reliable.

Output node ND may be driven by MIS transistors PT7 and NT8 with MIS transistor PT8 set in the non-conductive state in the normal mode.

In the case of the configuration shown in FIG. 13, in the normal mode, output data DQ can be raised to the H level from the L level at high speed. In the slow slew rate mode in which output node ND is gently driven, output node ND can be driven to the output power supply voltage VDDQ level at relatively high speed by using N-channel MIS transistor NT8. Even in the slow slew rate mode, output data DQ can be raised from the L level to the H level at high speed.

In the case of driving output node ND from the H level to the L level, in the normal mode, in a manner similar to the foregoing first and second embodiments, MIS transistors NT7 and NT8 are selectively made conductive in accordance with output control signals LO1 and LO2. In the slow slew rate mode, MIS transistor NT17 is made conductive and output node ND can be driven by a relatively small driving capability.

In the configuration shown in FIG. 13 as well, the voltage level of an output control signal applied to the gate of MIS transistor NT8 may be the voltage level of output power supply voltage VDDQ or may be boosted to a voltage level higher than the output power supply voltage VDDQ. In the case of using the boosting configuration, MIS transistor NT8 can be set in the conductive state at high speed, and the current driving capability can be also increased.

Where only MIS transistor NT8 is made conductive in the slow slew rate mode, if output data DQ is a signal at the CMOS level and it is necessary to drive output data signal DQ to the output power supply voltage level, the boosting configuration is used. In the case in which it is unnecessary to drive output data signal DQ to the full power supply voltage level as, for example, a signal at a TTL level, the boosting configuration does not have to be particularly provided.

As described above, according to the third embodiment of the invention, the output node is driven by using both the P-channel MIS transistor and N-channel MIS transistor. Thus, output data can be driven from the L level to the H level at high speed without increasing the circuit occupying area.

Fourth Embodiment

Figure 14:
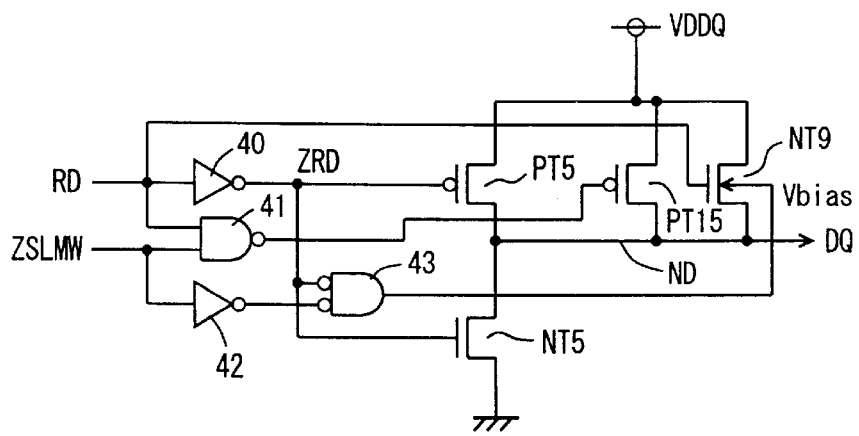
FIG. 14 is a diagram showing the configuration of a data output circuit according to a fourth embodiment of the invention.

FIG. 14 is a diagram schematically showing the configuration of a data output circuit according to a fourth embodiment of the invention. In FIG. 14, the data output circuit includes: an inverter 40 receiving internal read data RD; an NADN circuit 41 receiving internal read data RD and a complementary slew rate setting signal ZSLMW; an inverter 42 receiving complementary slew rate setting signal ZSLMW; an NOR circuit 43 receiving output signals of inverters 41 and 42; P-channel MIS transistor PT5 connected between the power supply node and output node ND, and receiving an output signal ZRD of inverter 40 at a gate thereof, a P-channel MIS transistor PT15 connected between the power supply node and output node ND and receiving an output signal of NAND circuit 41 at a gate thereof; an N-channel MIS transistor NT9 connected between the power supply node and output node ND, receiving internal read data RD at a gate thereof and receiving an output signal of NOR circuit 43 at a back gate thereof; and N-channel MIS transistor NT5 connected between output node ND and the ground node, and receiving complementary read data ZRD at a gate thereof.

In the data output circuit shown in FIG. 14, an output signal of NOR circuit 43 is supplied as a bias voltage Vbias to the back gate of N-channel MIS transistor NT9 connected between the power supply node and output node ND.

In the normal slew rate mode, complementary slew rate setting signal ZSLMW is set to the H level, and NAND circuit 41 operates as an inverter. When internal read data RD is at the H level, therefore, both MIS transistors PT5 and PT15 are made conductive, and the output node is driven by a large current driving capability. MIS transistor NT9 is also made conductive since internal read data RD is at the H level, and output node ND is driven to the H level.

In this state, both output signals of inverters 40 and 42 go low, the threshold voltage of MOS transistor NT9 decreases due to a back gate bias effect, and output node ND is driven to the H level at high speed. In the normal slew rate mode, back gate bias voltage Vbias rises synchronously with the rising of internal read data, and the threshold voltage of MIS transistor NT9 therefore decreases in accordance with the rising of the internal read data.

By forming MIS transistor NT9 in a well so as to be isolated from other elements, even when the back gate of MIS transistor NT9 attains the power supply voltage level, back gate bias voltage Vbias does not exert an adverse influence on the other elements. In MIS transistor NT9, even when a current flows from the back gate to output node ND, when the output node is driven to the power supply voltage level, then PN junction between the back gate and the drain of MIS transistor NT9 is made nonconductive.

When internal read data RD goes low in the normal slew rate mode, complementary internal read data ZRD goes high, an output signal of NOR circuit 43 goes low, back gate bias voltage Vbias of MIS transistor NT9 accordingly attains the ground voltage level, and the threshold voltage increases (back gate effect does not occur). Upon operation, MIS transistors PT5 and PT15 are also made non-conductive synchronously with the falling of internal read data RD. MIS transistor NT5 is made conductive synchronously with the falling of internal read data RD to drive output node ND to the ground voltage level.

In the slow slew rate mode, complementary slew rate setting signal ZSLMW is set to the L level, an output signal of NAND circuit 41 is fixed to the H level, and MIS transistor PT15 is fixed to the non-conductive state. Since an output signal of inverter 42 is fixed to the H level, an output signal of NOR circuit 43 attains the ground voltage level, back gate bias voltage Vbias of MIS transistor NT9 is fixed to the ground voltage level, and no back gate bias effect is produced. When internal read data RD goes high, therefore, output node ND is driven to the H level by MIS transistors PT5 and NT9. However, since the threshold voltage of MIS transistor NT9 is set to be low, output node ND is driven by a smaller current driving capability as compared with that in the normal mode.

When bias voltage Vbias is driven to a voltage level higher than the ground voltage, the threshold voltage of N-channel MIS transistor NT9 can be made lower than that in the case where the back gate is connected to the ground node. Accordingly, output node ND can be driven from the L level to the H level at high speed.

In the case of driving output node ND to the L level, by driving back gate bias voltage Vbias of MIS transistor NT9 to the ground voltage level, the current driving capability of MIS transistor NT9 can be decreased to reduce a through-current, for driving the output node to the ground voltage level at high speed.

An output control signal generated by the slew rate setting signal and internal read data may be applied to MIS transistor NT5 for discharging. Specifically, also for discharging transistors, as shown in FIG. 13, two N-channel MIS transistors may be connected in parallel to the output node and set in a conductive state selectively in accordance with the normal slew rate mode or the slow slew rate mode according to the output control signal.

In the foregoing embodiments, each of output control signals HO and LO is generated by combining internal read data and the slew rate setting signal as shown in FIG. 14.

The H level of bias voltage Vbias may be a voltage level of the output power supply node (in this case, NOR circuit 43 has the level converting function), or may be the internal power supply voltage level. As will be described later, the inverter and the NAND circuit generate a level-converted signal. NOR circuit 43 therefore receives signal ZRD at the output power supply voltage level. It is therefore preferable to set the H level of bias voltage Vbias to output power supply voltage VDDQ. Each of internal read data RD and slew rate setting signal ZSLMW may be a signal having an amplitude of the output power supply voltage VDDQ level.

In the circuit configuration as shown in FIG. 12 or 13, for example, similarly, by setting the back gate bias of pull-up N-channel MIS transistor NT6 or NT8 to a positive voltage level in accordance with internal read data (output control signal), the output node can be driven at high speed.

Figure 15:
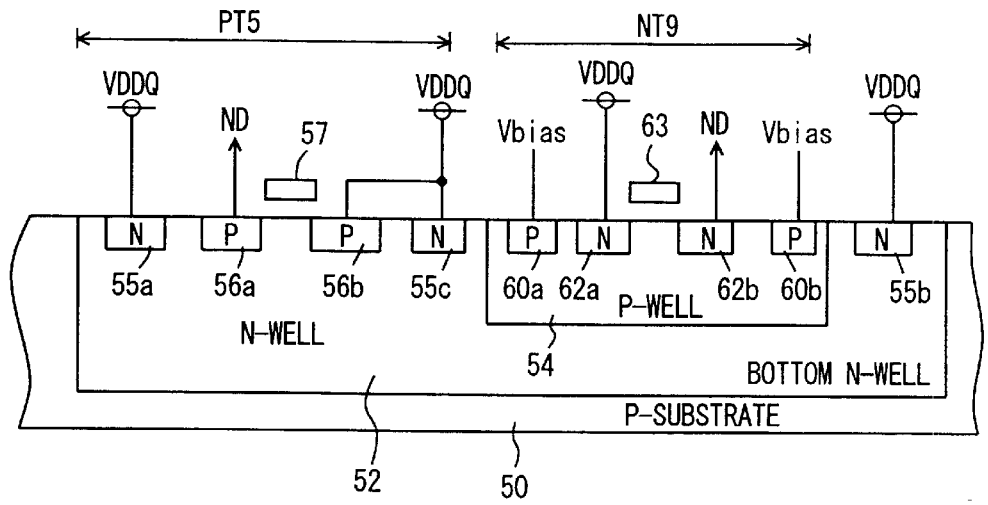
FIG. 15 is a diagram schematically showing the cross-sectional structure of the data output circuit illustrated in FIG. 14.

FIG. 15 is a diagram schematically showing a cross sectional structure of MIS transistors PT5 and NT9 illustrated in FIG. 14. In FIG. 15, the data output circuit is formed in an N well 52 formed on the surface of a P-type substrate 50. On the surface of N-well 52, a P-well is formed. Under P-well 54, N-well is formed extending continuously, to provide a bottom N-well. P-well 54 is surrounded by the bottom N well and isolated from P-type substrate 50.

N-well 52 is biased to the output power supply voltage VDDQ level by N-type impurity regions 55a, 55b, and 55c formed on the surface thereof. On the other hand, P-well 54 is held at the bias voltage Vbias level by P-type impurity regions 60a and 60b formed on the surface thereof. Even when P-well 54 is at a positive voltage level, N-well 52 is set to the output power supply voltage VDDQ level higher than the positive voltage level, and P-well 54 and N-well 52 are isolated from each other with reliability. Bias voltage Vbias is at a voltage level equal to or lower than a diffusion potential to N-type impurity regions 62a and 62b formed at the surface of P-well 54, thereby preventing the PN junction from being biased in the forward direction in P-well 54.

P-channel MIS transistor PT5 includes P-type impurity regions 56a and 56b formed apart in the surface of N-well 52, and a gate electrode 57 formed on a channel region between impurity regions 56a and 56b with a not-shown gate insulating film interposed. Output power supply voltage VDDQ is applied to impurity region 56b, and impurity region 56a is connected to output node ND.

FIG. 15 shows the configuration of MIS transistor PT5, however, MIS transistor PT15 is formed in N-well 52, similarly.

N-channel MIS transistor NT9 includes N-type impurity regions 62a and 62b formed apart at the surface of P-well 54, and a gate electrode 63 formed above the surface of a channel formation region between impurity regions 62a and 62b with a not-shown gate insulating film interposed. Impurity region 62a is connected to the power supply node and impurity region 62b is connected to output node ND.

As shown in FIG. 15, N-well 52 is formed extending under P-well 54 and P-type substrate 50 and P-well 54 are isolated from each other by the bottom N-well. Consequently, an isolation region for isolating the well in which P-channel MIS transistor PT5 is formed and the well in which N-channel MIS transistor NT9 is formed, which is necessary for forming normal CMOS transistors is unnecessary. Thus, the area of the region for forming a pull-up transistor in the data output circuit can be reduced. P-well 54 is merely formed at the surface of N-well (bottom N-well) 52, and an isolation region for isolating wells formed separately in the same semiconductor substrate regions is unnecessary. By using P-well 54 isolated from the P-type substrate, the back gate bias of the N-channel MIS transistor can be led to a voltage level higher than the ground voltage.

In the configuration of surrounding P-well 54 for forming N-channel MIS transistor NT9 by using the bottom N-well, even when bias voltage Vbias changes between the ground voltage level and the output power supply voltage level, since P-well 54 is electrically isolated from N-well 52 for forming another element, no problem occurs. Since N-well 52 is biased to output power supply voltage VDDQ and the highest possible voltage of P-well 54 is output power supply voltage VDDQ, the PN junction of these wells is not forward-biased at all.

When bias voltage Vbias of P-well 54 is driven to the output power supply voltage level, a current transiently flows from P-well 54 to output node ND via impurity region 62b. Even in this case, when output node ND is driven to the output power supply voltage level, the PN junction between P-well 54 and impurity region 62b is reverse-biased to cut off the current flowing path. Specifically, when the voltage difference between P-well 54 and impurity region 62b becomes smaller than a built-in voltage of the PN junction, the PN junction enters a non-conductive state.

Also in a configuration that both the P-channel MIS transistor and the N-channel MIS transistor are used as pull-up transistors in the configurations shown in FIGS. 12 and 13, the configuration of the bottom well shown in FIG. 15 can be used. Although the effect of decreasing the threshold voltage may not be obtained, the layout area of the region for forming the P-channel MIS transistor and the N-channel MIS transistor can be reduced.

As described above, according to the fourth embodiment of the invention, the back gate voltage of the N-channel MIS transistor for pulling up the output node is set to a voltage level higher than the ground voltage. Thus, the output node can be driven at high speed with a reduced threshold voltage.

By forming the N-channel MIS transistor for pulling up an output in the P-well surrounded by the bottom N-well, a region for isolating the P-well from the N-well in forming CMOS transistors (complementary MIS transistors) becomes unnecessary, and the circuit occupying area can be reduced.

Fifth Embodiment

Figure 16:
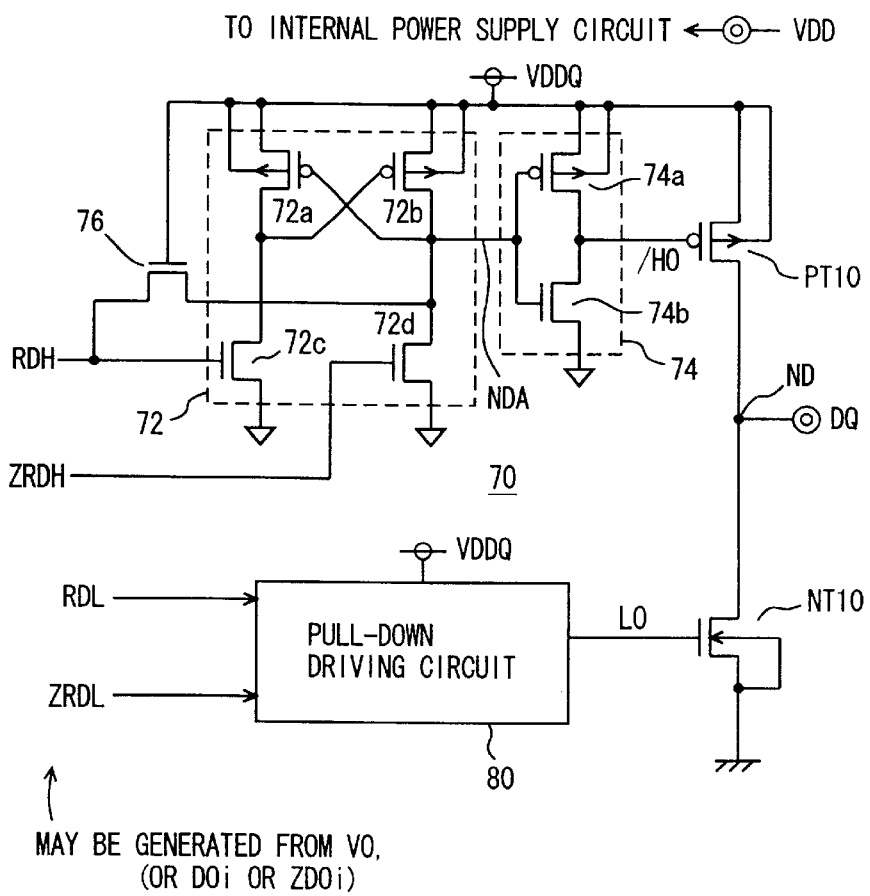
FIG. 16 is a diagram schematically showing the configuration of a data output circuit according to a fifth embodiment of the invention.

FIG. 16 is a diagram showing the configuration of a data output circuit according to a fifth embodiment of the invention. In FIG. 16, the data output circuit includes: a pull-up driving circuit 70 for generating output control signal /HO in accordance with output control signals RDH and ZRDH; a P-channel MIS transistor PT10 for charging output node ND to the output power supply voltage VDDQ level in accordance with output control signal /HO of pull-up driving circuit 70; a pull-down driving circuit 80 for generating output control signal LO in accordance with output control signals RDL and ZRDL; and an N-channel MIS transistor NT10 for driving output node ND to the ground voltage level in accordance with output control signal LO output from pull-down driving circuit 80.

Pull-up driving circuit 70 and pull-down driving circuit 80 receive output power supply voltage VDDQ as an operation power supply voltage, and convert output control signals RDH, ZRDH, RDL, and ZRDL each having an amplitude of the internal power supply voltage (peripheral power supply voltage) level to signals each having an amplitude of the output power supply voltage VDDQ level.

Each of output control signals RDH, ZRDH, RDL, and ZRDL may be a signal at the internal power supply voltage level set in accordance with the slew rate as shown in the foregoing first and second embodiments or complementary internal read data having an amplitude of the internal power supply voltage internally read from the memory circuit.

Pull-up driving circuit 70 includes: a level converting circuit 72 receiving output control signals RDH and ZRDH at the amplitude of internal power supply voltage level and generating a signal having an amplitude of the output power supply voltage VDDQ level to internal node NDA; and a CMOS inverter 74 for generating output control signal /HO at the amplitude of output power supply voltage VDDQ level in accordance with an output signal of level converting circuit 72.

Level converting circuit 72 includes: P-channel MIS transistors 72a and 72b having back gates and sources connected to the output power supply node; an N-channel MIS transistor 72c for electrically coupling the drain of P-channel MIS transistor 72a to the ground node in accordance with output control signal RDH; and an N-channel MIS transistor 72d for coupling the drain (node NDA) of the P-channel MIS transistor to the ground node in accordance with output control signal ZRDH. The gates and drains of P-channel MIS transistors 72a and 72b are cross-coupled to each other.

CMOS inverter 74 includes: a P-channel MIS transistor 74a having a back gate and a source connected to the output power supply node receiving output power supply voltage VDDQ, a gate connected to internal node NDA, and a drain connected to the gate of MIS transistor PT10; and an N-channel MIS transistor 74b connected between the gate of MIS transistor PT10 and the ground node and having a gate connected to internal node NDA.

Pull-up driving circuit 70 further includes an N-channel MIS transistor 76 for electrically connecting internal node NDA and a node receiving output control signal RDH in accordance with a voltage at the output power supply node.

Pull-down driving circuit 80 includes a level converting circuit having the same configuration as that of level converting circuit 72 and a CMOS inverter having the same configuration as that of CMOS inverter 74. In pull-down driving circuit 80, MIS transistor 76 is not particularly provided. By equaling, in configuration, pull-down driving circuit 80 and pull-up driving circuit 70, the delay time in level converting is made the same.

Output power supply voltage VDDQ is applied externally independently of power supply voltage VDD from which other internal power supply voltages are generated, so as to be exclusively used for data output in the data output circuit. A sequence of turning up power supply voltages VDD and VDDQ and a sequence of turning down power supply voltages VDD and VDDQ are not particularly determined. For example, even when external power supply voltage VDD is cut off, a state where output power supply voltage VDDQ is still supplied exists. Moreover, a power up sequence of applying output power supply voltage VDDQ, followed by the turn up of power supply voltage VDD exists. In a state in which output power supply voltage VDDQ is supplied and power supply voltage VDD is not supplied, output control signals RDH and ZRDH are at the L level. Internal circuits for generating signals RDH and ZRDH are generated from peripheral circuitry receiving an internal power supply voltage (peripheral power supply voltage) generated by using power supply voltage VDD supplied externally.

In this state, when both MIS transistors 72c and 72b are turned off, a case that node NDA is charged to the output power supply voltage VDDQ level via P-channel MIS transistor 72b may occur. When node NDA is charged to the output power supply voltage VDDQ level, output control signal /HO output from CMOS inverter 74 attains the L level of the ground voltage level. P-channel MIS transistor PT10 at the output stage becomes conductive to supply the current to output node ND. Consequently, such a problem arises that output node ND does not turns output high impedance state and an erroneous operation occurs in other external device.

When such a situation occurs at the time of power up, a current is unnecessarily consumed, and such a problem arises that current consumption increases.

However, when output control signal RDH goes low in a state in which output power supply voltage VDDQ is supplied, MIS transistor 76 is made conductive to drive internal node NDA to the ground voltage level via output control signal RDH. Accordingly, output control signal /HO output from CMOS inverter 74 attains the output power supply voltage VDDQ level, so that MIS transistor PT10 can be maintained in the OFF state, and an output high impedance state can be achieved.

Therefore, in the power up sequence and the power down sequence, even in the case where external power supply voltage VDD is not supplied in a state in which output power supply voltage VDDQ is supplied, output MIS transistor PT10 can be held in the off state with reliability, and a current can be prevented from being unnecessarily supplied to output node ND.

In the normal operation, when output control signal RDH goes low and output control signal ZRDH goes high, internal node NDA is driven to the ground voltage level by MIS transistor 72d. In this case, therefore, no problem occurs even when MIS transistor 72c is turned on. When output control signal RDH is at the H level and output control signal ZRDH is at the L level, MIS transistor 72c is turned on, and node NDA is coupled to the internal signal line for transmitting output control signal RDH of the H level. However, by making the current driving capability of MIS transistor 72c sufficiently lower than that of a transistor for driving output control signal RDH to the internal power supply voltage level and that of MIS transistor 72b for charging internal node NDA, internal node NDA can be driven to the output power supply voltage VDDQ level in the normal operation, and no problem occurs in the normal operation. At this time, MIS transistor 76 has the source potential at the internal power supply voltage level, and the gate voltage at an output power supply voltage, and therefore, has a reduced current driving capability as compared with the case in which the source thereof is at the ground voltage level, and internal node NDA can be driven to the output power supply voltage level with reliability.

Specifically, when the internal power supply voltage is interrupted, a gate to source voltage of MIS transistor 72c becomes higher than that in the normal operation, internal node NDA is discharged, and MIS transistor 72a starts a charging operation to increase the gate potential of MIS transistor 72b for stopping the charging operation of MIS transistor 72b. Consequently, internal node NDA is discharged to the ground voltage level at high speed.

In pull-down driving circuit 80, when internal node NDA attains the H level (output power supply voltage VDDQ level), output control signal LO attains the L level of the ground voltage level, and MIS transistor NT10 is turned off, so that the problem of current consumption does not occur. Therefore, in both the power up sequence and the power down sequence, output node ND can be set in the output high impedance state with reliability, and reduction in current consumption and suppression of erroneous operation of an external device can be achieved with reliability.

Modification

Figure 17:
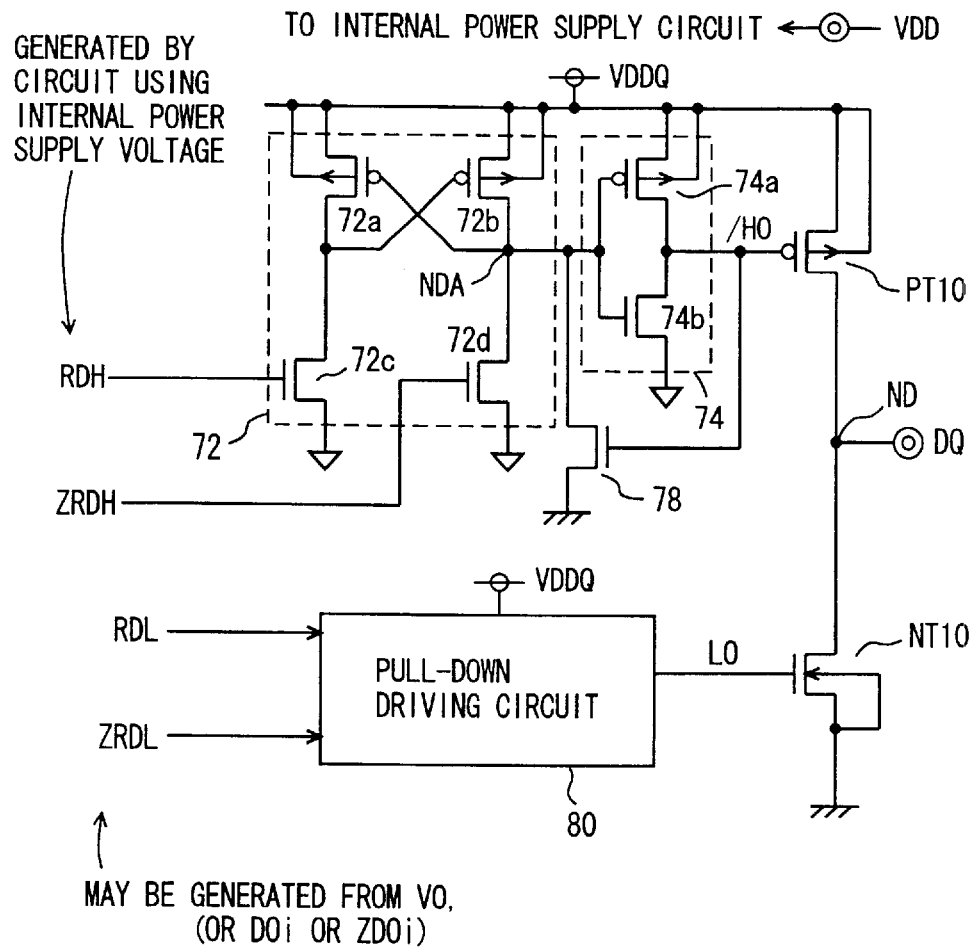
FIG. 17 is a diagram showing a modification of the fifth embodiment of the invention.
Figure 18:
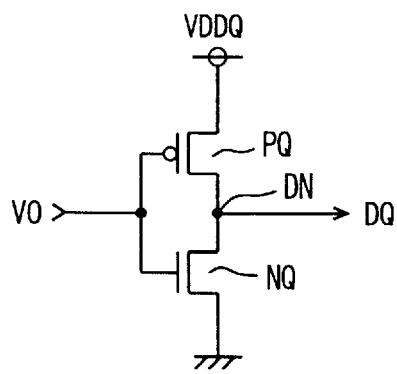
FIG. 18 is a diagram showing the configuration of an output stage of a conventional data output circuit.

FIG. 17 is a diagram schematically showing the configuration of a modification of the fifth embodiment of the invention. In the configuration of the data output circuit illustrated in FIG. 17, to internal node NDA, an N-channel MIS transistor 78 for driving internal node ND to the ground voltage level in accordance with output control signal /HO from CMOS inverter 74 is provided, alternative to MIS transistor 76 shown in FIG. 16. The other configuration is the same as that shown in FIG. 16, corresponding parts are designated by the same reference numerals, and the detailed description will not be repeated.

In the configuration of the data output circuit shown in FIG. 17, a state in which output power supply voltage VDDQ is supplied when output node ND is in the high impedance state and supply of external power supply voltage VDD is stopped is now assumed. In this state, output control signal /HO is at the H level and MIS transistor 78 is in the ON state. Therefore, even if such a situation arises that external power supply voltage VDD is not supplied, both output control signals RDH and ZRDH are at the L level, and both MIS transistors 72c and 72d are in the off state, internal node NDA is charged to the output power supply voltage VDDQ level via MIS transistor 72b due to an influence of noise or the like, internal node NDA is discharged to the ground voltage level with reliability because before the voltage level of internal node NDA increases, output control signal /HO is at the H level.

In this state, since the voltage level of internal node NDA is discharged to the ground voltage level via MIS transistor 78, MIS transistor 72a is turned on, MIS transistor 72b is turned off, the drain of MIS transistor 72a is driven to the output power supply voltage VDDQ level, and MIS transistor 72b can be held in the OFF state with reliability. Even when MIS transistor 78 is turned on, MIS transistor 72b maintains the OFF state. Consequently, a through-current is not caused to flow via MIS transistors 72b and 78, and current consumption can be therefore reduced. Also in this power up state, output node ND can be held in the high impedance state with reliability.

In the normal operation, when internal node NDA is at the ground voltage level, output control signal /HO is at H level. Therefore, even when MIS transistor 78 is made conductive in such a state, no problem occurs. When internal node NDA is at the H level, output control signal /HO is at the L level, and MIS transistor 78 is in a non-conductive state to exert no influence on the voltage level of internal node NDA.

The configuration shown in FIG. 16 or that in FIG. 17 is disposed in a portion for receiving output control signals for adjusting the slew rate.

The data output circuit according to the fifth embodiment of the invention shown in each of FIGS. 16 and 17 may be a general data output circuit having no slew rate adjusting function. The configuration of the fifth embodiment can be applied to any data output circuit having the level converting function.

In the case of using an N-channel MIS transistor for pulling up an output node and controlling the back gate bias of the pull-up MIS transistor in the configuration shown in FIG. 16, the voltage at node NDA is used as a bias voltage applied to the back gate of the pull-up N-channel MIS transistor.

As described above, according to the fifth embodiment of the invention, in the data output circuit of driving an output transistor in accordance with an output signal of the level converting circuit, the internal node is driven to the ground voltage level in accordance with the voltage level at the power supply node. Consequently, irrespective of the power up/down sequences, the output high impedance state is achieved with reliability, and current consumption can be prevented from being increased.

Other Examples

In the above configurations, the configurations of the data output circuit of the semiconductor memory device are described as an example. The invention however can be generally applied to an output circuit for driving an external load.

Each of the embodiments can be applied to an output circuit, singly or in combination.

As described above, according to the invention, the slew rate at which an output node of an output circuit is driven is switched between a normal mode and a slow slew rate mode slower than the normal mode. An output circuit which operates accurately with an optimum current consumption in accordance with an operation environment can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a plurality of transistors connected in parallel to an output node;

a register circuit for storing data for setting an operation state of each of said transistors, said register circuit storing either of a default value for designating a driving capability of said output node in a normal mode and slow slew rate data for designating a driving capability of said output node smaller than said default value; and an output driving circuit for driving said plurality of transistors in accordance with an internal signal, said output driving circuit selectively driving said plurality of transistors in accordance with said internal signal based on data stored in said register circuit.

2. The semiconductor device according to claim 1, wherein said plurality of transistors include a plurality of first transistors of a first conductivity type, connected in parallel to said output node, for charging said output node when made conductive, and a plurality of second transistors of a second conductivity type, connected in parallel to said output node, for discharging said output node when made conductive.

3. The semiconductor device according to claim 1, further comprising a delay circuit disposed in correspondence with a predetermined transistor in said plurality of transistors, for delaying an output signal of said output driving circuit.

4. The semiconductor device according to claim 3, wherein said predetermined transistor is a transistor that is set in an operable state in accordance with said slow slew rate data.

5. The semiconductor device according to claim 1, wherein said plurality of transistors include transistors of different conductivity types for driving said output node in a same direction when made conductive.

6. The semiconductor device according to claim 1, wherein said plurality of transistors include a plurality of insulated gate field effect transistors connected in parallel between a first power supply node and said output node and having back gates receiving different biases.

7. The semiconductor device according to claim 6, wherein the transistors having back gates receiving different biases are of different conductivity types.

8. The semiconductor device according to claim 7, wherein said transistors having back gates receiving different biases are transistors for pulling up said output node to a power supply voltage level when made conductive.

9. The semiconductor device according to claim 1, wherein said output circuit is a data output circuit in a semiconductor memory device, and said register circuit is a mode register provided in said semiconductor memory device and having stored data set when a mode set command is applied.

10. A semiconductor device comprising:

a level converting circuit for converting a level of an internal output signal having a first amplitude to convert the amplitude of said internal output signal, said level converting circuit receiving an external power supply voltage as an operation power supply voltage;

a driving circuit receiving said external power supply voltage as an operation power supply voltage and generating an output control signal in accordance with an output signal of said level converting circuit;

an output transistor for driving an output node to said external power supply voltage level in accordance with the output control signal from said driving circuit; and a reset transistor for driving an output node of said level converting circuit to a voltage level, at which said output transistor is turned off in accordance with a voltage level of an external power supply node receiving said external power supply voltage.

11. The semiconductor device according to claim 10, wherein said reset transistor drives the output node of said level converting circuit to a voltage level different from a voltage level of said external power supply voltage in accordance with the output control signal output from said driving circuit.

12. The semiconductor device according to claim 10, wherein said reset transistor connects the output node of said level converting circuit to a node, to which said internal output signal is transmitted, in accordance with a voltage of the power supply node receiving said external power supply voltage.

13. The semiconductor device according to claim 11, wherein said level converting circuit converts the amplitude of said internal output signal without changing a logic level of said internal output signal.

* * * * *